(12) United States Patent
Garrett et al.

(10) Patent No.: US 11,424,048 B2
(45) Date of Patent: Aug. 23, 2022

(54) COAXIAL CABLE UTILIZING PLATED CARBON NANOTUBE ELEMENTS AND METHOD OF MANUFACTURING SAME

(71) Applicant: Carlisle Interconnect Technologies Inc., St. Augustine, FL (US)

(72) Inventors: Natalie Garrett, Norristown, PA (US); Ronald A. Souders, Schwenksville, PA (US); Nicholas Pizzo, Ardmore, PA (US)

(73) Assignee: Carlisle Interconnect Technologies, Inc., St. Augustine, FL (US)

( * ) Notice: Subject to any disclaimer, the term of this patent is extended or adjusted under 35 U.S.C. 154(b) by 0 days.

(21) Appl. No.: 16/449,015

(22) Filed: Jun. 21, 2019

(65) Prior Publication Data
US 2020/0020462 A1 Jan. 16, 2020

Related U.S. Application Data (60) Provisional application No. 62/691,320, filed on Jun. 28, 2018, provisional application No. 62/789,138, filed on Jan. 7, 2019.

(51) Int. Cl.
*H01B 11/06* (2006.01)
*H01B 1/02* (2006.01)
(Continued)

(52) U.S. Cl.
CPC .............. *H01B 1/02* (2013.01); *C25D 5/10* (2013.01); *C25D 5/54* (2013.01); *C25D 7/06* (2013.01);
(Continued)

(58) Field of Classification Search
CPC ...... H01B 11/06; H01B 7/226; H01B 11/1847
See application file for complete search history.

(56) References Cited

U.S. PATENT DOCUMENTS

| 4,822,950 A | 4/1989 | Schmitt |
| 4,917,631 A | 4/1990 | Souders et al. |

(Continued)

FOREIGN PATENT DOCUMENTS

| JP | 2000207953 A | 7/2000 |
| JP | 3769405 B2 | 4/2006 |
| WO | 2005098874 A1 | 10/2005 |

OTHER PUBLICATIONS

U.S. Patent and Trademark Office; Search Report and Written Opinion in related International Patent Application No. PCT/US2019/039181 dated Sep. 11, 2019; 9 pages.

*Primary Examiner* — Chau N Nguyen
(74) *Attorney, Agent, or Firm* — Wood Herron & Evans LLP (57) ABSTRACT

A cable includes at least one inner conductor and an insulation layer surrounding the inner conductor. An outer conductive layer surrounds the insulation layer and center conductor and includes a carbon nanotube substrate having opposing face surfaces and edges. One or more metals are applied as layer(s) to the opposing face surfaces and edges of the carbon nanotube substrate for forming a metallized carbon nanotube substrate. The metallized carbon nanotube substrate is wrapped to surround the insulation layer and center conductor for forming the outer conductive layer. Embodiments of the invention include a braid layer positioned over the outer conductive layer. The braid layer is woven from of plurality of carbon nanotube yarn elements made of a plurality of carbon nanotube filaments. The carbon nanotube filaments include a carbon nanotube core and metal applied as a layer on the carbon nanotube core for forming a metallized carbon nanotube filaments and yarns woven to form the braid layer.

18 Claims, 7 Drawing Sheets

(51) Int. Cl.
    *H01B 11/18*    (2006.01)
    *C25D 7/06*     (2006.01)
    *H01B 13/016*   (2006.01)
    *H01B 1/04*     (2006.01)
    *H05K 9/00*     (2006.01)
    *C25D 5/10*     (2006.01)
    *C25D 5/54*     (2006.01)

(52) U.S. Cl.
    CPC ............ *H01B 1/04* (2013.01); *H01B 11/1813* (2013.01); *H01B 11/1817* (2013.01); *H01B 11/1869* (2013.01); *H01B 13/0165* (2013.01); *H05K 9/0098* (2013.01)

(56) References Cited

U.S. PATENT DOCUMENTS

| | | | |
|---|---|---|---|
| 6,815,611 B1 * | 11/2004 | Gareis | ............... H01B 11/1025 174/36 |
| 7,301,109 B2 | 11/2007 | Chen | |
| 7,345,242 B2 | 3/2008 | Chen | |
| 7,354,877 B2 | 4/2008 | Rosenberger et al. | |
| 7,360,461 B2 | 4/2008 | Desrochers et al. | |
| 7,390,970 B2 | 6/2008 | Lee et al. | |
| 7,459,627 B2 | 12/2008 | Lee et al. | |
| 7,465,879 B2 | 12/2008 | Glew | |
| 7,491,883 B2 | 2/2009 | Lee et al. | |
| 7,588,700 B2 | 9/2009 | Kwon et al. | |
| 7,750,240 B2 | 7/2010 | Jiang et al. | |
| 8,247,036 B2 | 8/2012 | Jiang et al. | |
| 8,558,105 B2 | 10/2013 | Carroll et al. | |
| 8,632,879 B2 | 1/2014 | Weisenberger | |
| 8,853,540 B2 | 10/2014 | Adriaenssens | |
| 8,926,933 B2 | 1/2015 | Zhang et al. | |
| 9,044,593 B2 | 6/2015 | Li et al. | |
| 9,055,667 B2 | 6/2015 | Doneker et al. | |
| 9,526,195 B2 * | 12/2016 | Su | ........................ H05K 9/0088 |
| 9,685,258 B2 | 6/2017 | Silverman et al. | |
| 2002/0029896 A1 * | 3/2002 | Yokoi | .................. H01B 11/183 174/102 R |
| 2004/0020681 A1 | 2/2004 | Hjortstam et al. | |
| 2007/0268085 A1 | 11/2007 | Egan | |
| 2008/0057265 A1 | 3/2008 | Liang et al. | |
| 2008/0165466 A1 | 7/2008 | Gritter et al. | |
| 2010/0000754 A1 | 1/2010 | Mann et al. | |
| 2010/0159240 A1 | 6/2010 | Shah et al. | |
| 2013/0025907 A1 | 1/2013 | Zheng et al. | |
| 2013/0233595 A1 | 9/2013 | Cooper et al. | |
| 2014/0080378 A1 * | 3/2014 | Wasynczuk | ............... H01B 1/04 442/379 |
| 2014/0102755 A1 | 4/2014 | Adriaenssens | |
| 2016/0039184 A1 * | 2/2016 | Tailor | ..................... B32B 15/08 428/355 N |
| 2017/0136694 A1 | 5/2017 | Rezai et al. | |
| 2017/0162300 A1 | 6/2017 | Hasan et al. | |

* cited by examiner

COAXIAL CABLE UTILIZING PLATED CARBON NANOTUBE ELEMENTS AND METHOD OF MANUFACTURING SAME

CROSS-REFERENCE

This application claims the benefit of priority to U.S. Provisional Patent Application Ser. No. 62/691,320, filed on Jun. 28, 2018, and U.S. Provisional Patent Application Ser. No. 62/789,138, filed on Jan. 7, 2019, , the applications and disclosures of which are incorporated by reference herein.

TECHNICAL FIELD

The present invention relates generally to cables and specifically to cables having an inner conductor element and outer layers or shielding layers incorporating carbon nanotube (CNT) elements.

BACKGROUND

Coaxial cables and other cables with multiple conductors, such as twin axial (twinax) cables with two inner conductors, or cables with four or eight or some other number of inner conductors, are utilized for a large number of different electrical systems and applications. Generally, such cables are electrical cables that includes one or more inner conductors or inner conductors and one or more outer conductive layers or outer conductors separated by an insulation layer. Over the conductors, additional layers, such as shields, strength layers and jackets might be used. While the inner conductors may be a solid or stranded wire, the outer conductive layer or outer conductor is often a metal foil that is wound around the insulating layer and inner conductor(s). There can be multiple outer conductive layers or outer conductors. The internal insulation layer between conductors is formed of a suitable dielectric material that provides physical support within the cable, keeps a spacing between the inner conductor and outer conductive layer, and also keeps the two electrical components electrically isolated.

The inner conductor elements, insulation layer, and outer conductive layers/conductors all have a significant effect on the cable's electrical properties, such as its impedance and attenuation properties. The outer conductive layers also act as a shield in various ways and ensure that a signal to be transmitted in the cable is contained inside the cable and that the other outside signals are kept out. The outer conductive layers also serve as secondary conductors or ground in signal transmission. Such cables are often utilized in high-frequency transmission lines to carry broadband signals or other high-frequency signals.

One particular material often utilized for the outer conductive layer or conductor is a foil material that may be formed from a silver plated copper material. Such materials, as may be appreciated, are heavy. In applications where multiple cables are bundled, the weight may become somewhat significant for certain applications. For example, in aircraft applications, the weight contributed by the many power and communication cables is obviously of particular concern. The electrical/mechanical properties of such a foil for the outer conductive layer is highly dependent upon the way in which the material is worked and annealed. As such, the process is often highly variable from start to finish. Furthermore, since such copper based foils are often formed from a round silver plated copper wire that is then flattened, the surface finish of the foil may be uneven and may have reflective discontinuities. This can detrimentally affect the performance of the cable, which requires consistent characteristic impedance control to minimize unwanted signal reflections back to the signal source.

Furthermore, any exposed copper can present a corrosion risk which has the ability to erode the electrical performance in the cable. Still further, the foil may be significantly thick enough to make it more rigid and less conformable for making a good electrical contact when wrapped around the inner conductors and any insulation layer or layers, in addition to adding significantly to the weight of the cable.

Accordingly, there is still a need for an improved cable design with one or more inner conductors surrounded by one or more outer conductive layers or conductors, that provide a robust, flexible, and lightweight cable with improved performance characteristics over current designs.

SUMMARY OF THE INVENTION

A cable includes an inner conductor and an insulation layer that surrounds the outside of the inner conductor. An outer conductive layer surrounds the insulation layer and inner conductor. The outer conductive layer includes a CNT substrate. One or more metal layers are applied to the CNT substrate through a continuous electroplating process for forming a plated CNT substrate that has plating on both sides of the substrate. In alternative embodiments the inner conductor including a plurality of carbon nanotube yarn elements with each yarn element including a plurality of carbon nanotube filaments. The carbon nanotube filaments includes a carbon nanotube core and at least one metal layer applied to the carbon nanotube core through an electroplating process for forming a plated carbon nanotube filament. In another alternative embodiment, a braid layer is used on the outside of the outer conductive layer and is formed of plurality of carbon nanotube yarn elements that include the plated carbon nanotube filaments. The carbon nanotube yarn elements are woven to form the braid layer.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF EMBODIMENTS OF THE INVENTION

Figure 1:
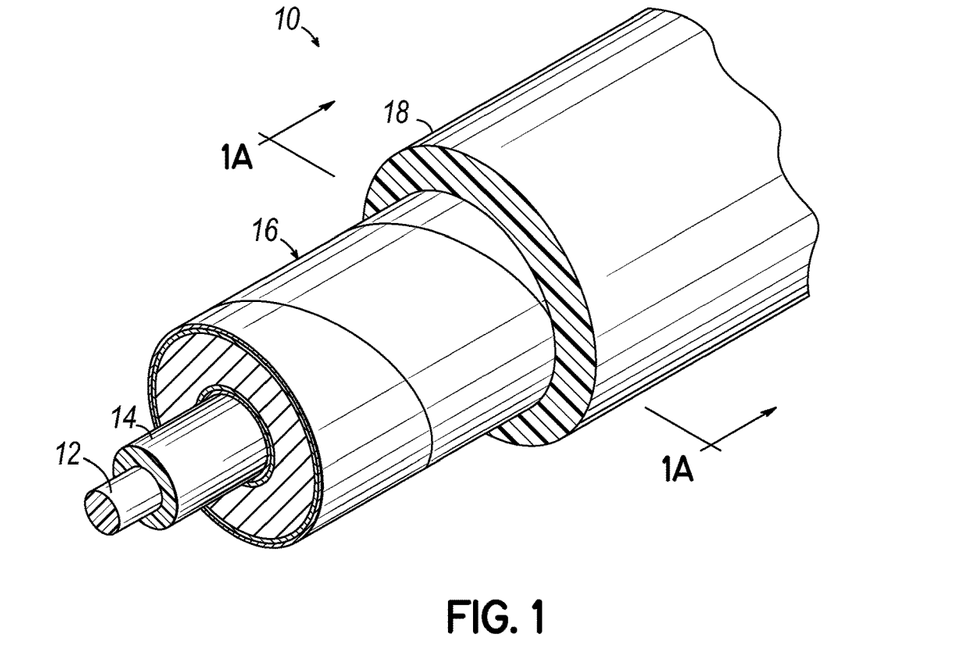
FIG. 1 is a perspective view, in partial cross-section, of a cable formed in accordance with an embodiment of the invention.
Figure 1A:
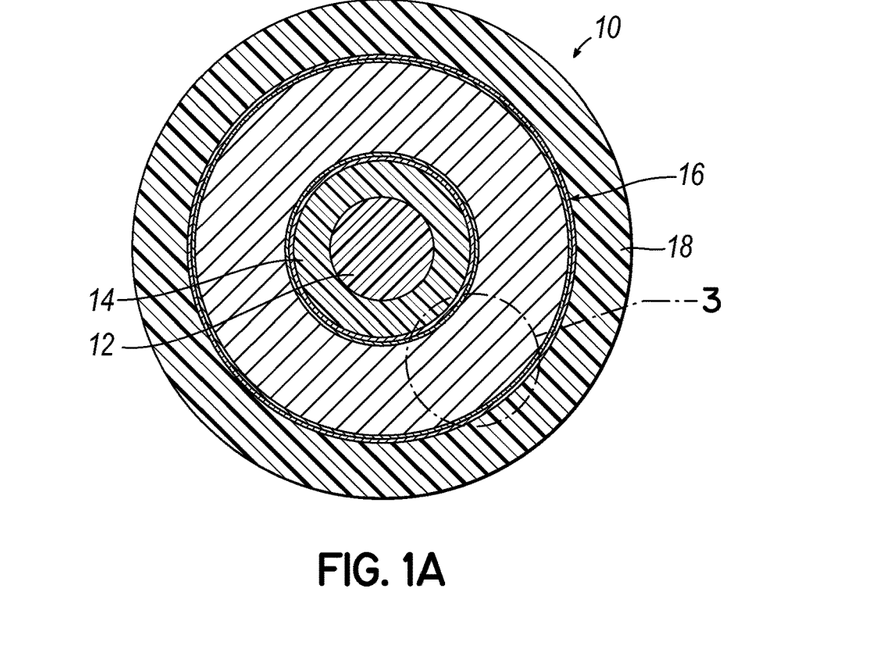
FIG. 1A is a cross-sectional view of the cable in FIG. 1.
Figure 2A:
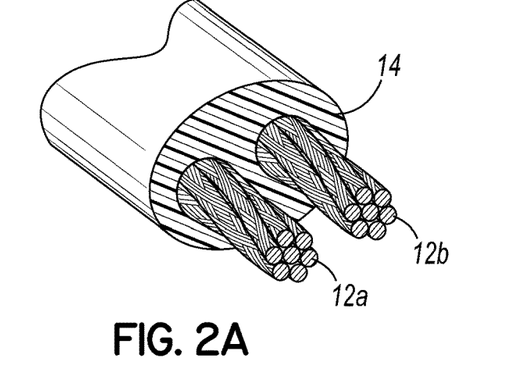
FIGS. 2A, 2B, 2C are cross-sectional views illustrating inner conductor elements for cables in accordance with additional embodiments of the invention.
Figure 2B:
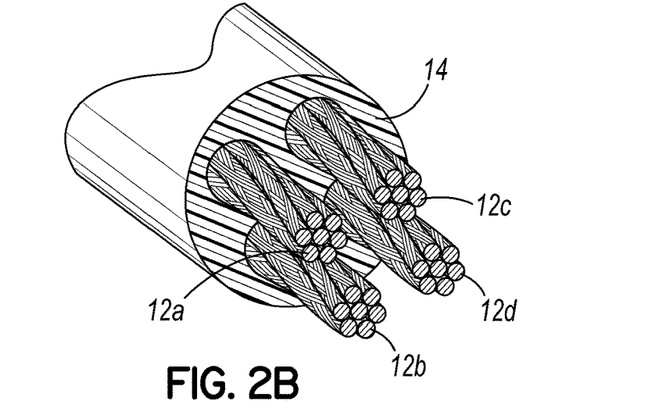
Figure 2C:
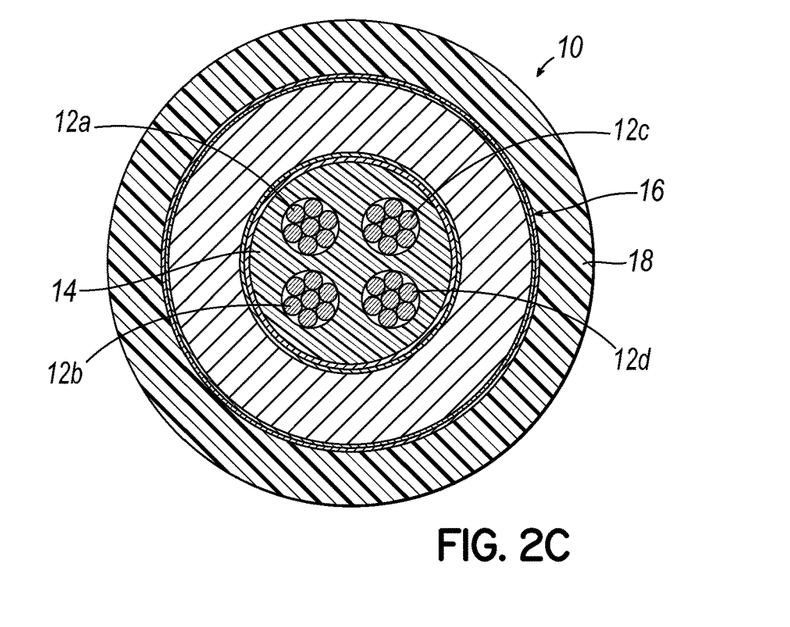

FIG. 1 illustrates a cable structure or cable 10 in accordance with one embodiment and incorporating features of the present invention. Specifically, the cable structure 10 of FIG. 1 is illustrated as a coaxial cable and includes at least one inner conductor 12 for carrying current. The FIG. 1 illustrates a single inner conductor element, but multiple inner conductor elements may be used and configured together to form the inner conductor 12 of the cable. For example, referring to FIGS. 2A, 2B and 2C the cable structure in accordance with the invention and utilizing features of the invention may also use multiple inner conductor elements, such as two elements 12a, 12b as shown in FIG. 2A. Such inner conductors are then surrounded by one or more insulation layers 14 and other various layer components as shown in FIG. 2C and described herein in accordance with the invention. The cable structure as shown in FIG. 2A is often referred to as a twin axial or twin ax cable. FIGS. 2B and 2C on the other hand illustrates four inner conductor elements 12a, 12b, 12c and 12d which are surrounded by an insulation layer 14, outer conductive layer 16 and other layers as described. The cable might be referred to as a quadrax cable. As will be readily understood by a person of ordinary skill in the art, a greater number of inner conductor elements may also be utilized in cables using the features of the invention. The present invention is thus not specifically limited to the number of different inner conductor elements 12 that are used in the cable design. For the purpose of simplicity, various embodiments of the invention will be described and illustrated with respect to a cable having a single inner conductor element, but the invention is not limited as such, and the specific construction disclosed herein with respect to the outer conductor and other elements may be utilized with a greater number of inner conductor elements than those illustrated herein in the various figures. For example, FIG. 2C shows an embodiment similar to FIG. 1A but with multiple conductors.

In accordance with various embodiments of the invention, the cable 10 may incorporate inner conductor elements or inner conductors having different constructions. For example, the inner conductor 12 as illustrated in FIG. 1 might be a solid conductor. Or the inner conductor may be a stranded conductor made of a suitable conductive material, such as copper or some other appropriately conductive metal. In accordance with another embodiment of the invention, as disclosed herein, the inner conductor 12 may incorporate metalized CNT elements. For example, the inner conductor may incorporate a twisted CNT metalized yarn construction that includes individual filaments that are sufficiently metalized with a metal layer for carrying the desirable current. The inner conductor elements may have an overall diameter in the range of 0.010-0.020 inches. As noted herein, cables will incorporate various different combinations of outer conductive layers and/or shield layers or "shields". Such cable constructions as disclosed may utilize a traditional solid or stranded metal inner conductor or may utilize a stranded inner conductor or with the disclosed metalized CNT technology for an inner conductor as described.

Figure 7:
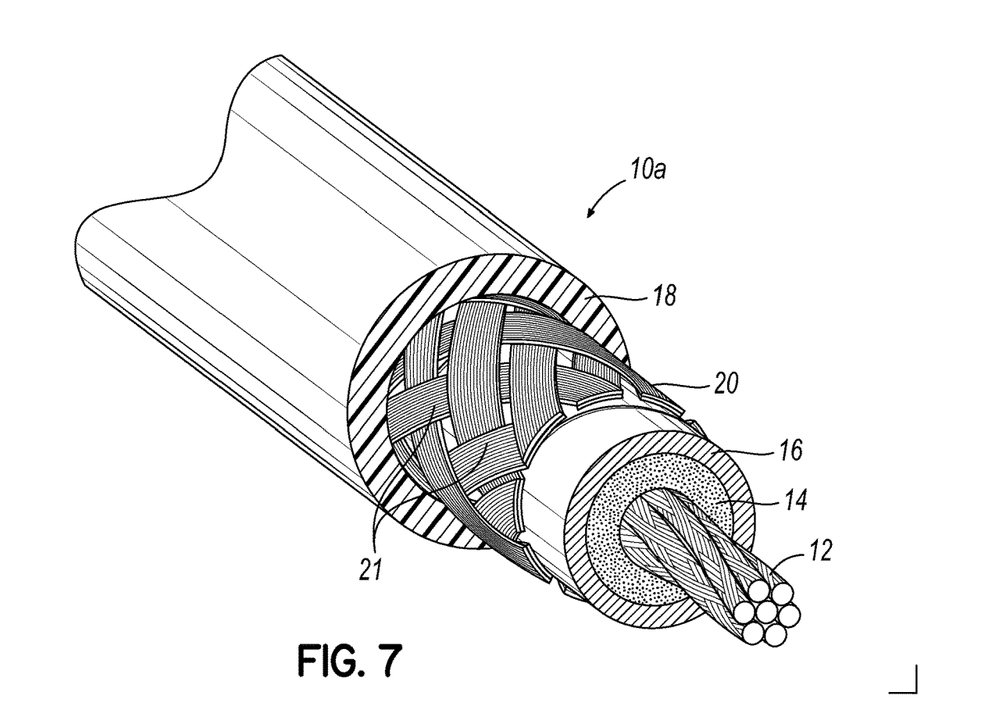
FIG. 7 is a perspective view, in partial cross-section, of a cable formed in accordance with an embodiment of the invention.

Referring again to FIG. 1A, one embodiment of a cable of the invention is illustrated. The inner conductor 12 may be a solid or stranded metal conductor or a stranded metalized CNT conductor, as described. Surrounding the outside of the inner conductor 12 is an insulation layer 14 to provide both structure and electrical isolation between the inner conductor and an outer conductive layer(s) 16 or shield layer(s) 20 as discussed herein. The embodiment illustrated in FIG. 1A does not implement a shield layer 20 as shown. However, another embodiment, as illustrated in FIG. 7, might use a shield layer 20 such as a braided shield. As discussed herein, the shield layer 20 may be a traditional metal shield or might use metalized CNT elements in accordance with the invention. As noted, the construction of the embodiment of FIGS. 1, 1A is applicable as well with multiple inner conductor elements as shown in FIG. 2C. Such a cable construction with an insulated inner conductor is generally known, and the insulation layer 14 may be a layer that is extruded or wrapped onto the inner conductor and may include any number of suitable insulative and/or dielectric materials, such as polytetrafluoroethylene (PTFE) or Teflon. As may be appreciated, for illustrative purposes, only one layer 14 is shown, but the insulation layer 14 may incorporate more than one layer. The insulation layer(s) may have a thickness in the range of 0.002 to 0.010 inches, for example.

In accordance with one aspect of invention, an outer conductive layer outer conductor 16 surrounds the insulation layer(s) 14 and inner conductor element(s) 12 to form the cable outer conductor. In one embodiment of the invention as illustrated in FIGS. 1 and 1A, the outer conductive layer 16 includes a carbon nanotube (CNT) substrate element that is metalized with one or more metal layers. The plating is applied to opposing face surfaces and edges of the substrate including both of the large faces and the edges of the substrate together for generally forming a fully coated or metalized CNT substrate. Specifically, in one embodiment of the invention, the CNT substrate has at least one metal that is applied as a layer to the substrate to form the metalized CNT substrate. For example, an electroplating process might be used to make a metalized CNT substrate to be used as the outer conductive layer 16. In that way, a metalized CNT substrate element is formed that may be wrapped to surround the inner conductor element(s) 12 and insulation layer(s) 14 in order to form the outer conductive layer 16 in accordance with the invention. As described herein, the metalized CNT substrate may be passed through a continuous electroplating process as described herein and is entirely coated to form the metalized CNT substrate for wrapping, similar to a tape, around the other layers. As such, it forms two metal conductive layers, one on each side of the CNT substrate.

As illustrated in FIG. 1, the outer conductive layer or outer conductor 16 is formed by an overlapping wrap of the plated CNT substrate. Due to the metallization process, the CNT substrate is generally completely covered with at least one or more metal layers and thus provides an outer conductive layer 16 that operates as a traditional outer conductor within the cable construction. The metalized CNT substrate is lightweight because of the weight aspects of the CNT substrate material. This results in significant weight savings over traditional foil outer conductors in the cable design. Accordingly, cable 10 utilizing the inventive construction greatly reduces the weight of the outer conductive layer 16 as well as the weight of the overall cable 10 that uses such an outer conductive layer.

It will be appreciated that the illustrated thicknesses of the various layers shown as well as the relative thickness of one layer versus another layer is for illustration and is not limiting in this invention. Rather, the layers are shown to illustrate their relative positioning with respect to each and the interaction of the layers rather than absolute dimensions. Accordingly, various different thicknesses may be used in the construction of the invention.

In accordance with one embodiment of the invention, the outer conductive layer 16 includes a plurality of conductive metals applied as layers such as sequentially, to the CNT substrate. Each of the conductive layers might be applied through a continuous electroplating process onto a CNT substrate, as described herein, that is directed to the particular metal layer that is applied. In one specific embodiment, a copper layer is initially applied on the CNT substrate at a desired thickness. Then, a silver layer is applied on the outside of the applied copper layer. Optional outer layers, such as nickel or tin might be used as well for the stability of the copper and silver layers. Also, the sequence of the layers might be varied such that silver might be applied or deposited first and copper applied thereafter. The discussed embodiment refers to copper and silver as possible metals to be plated on the CNT substrate, however, other metals might be used in accordance with features of the invention.

Figure 3:
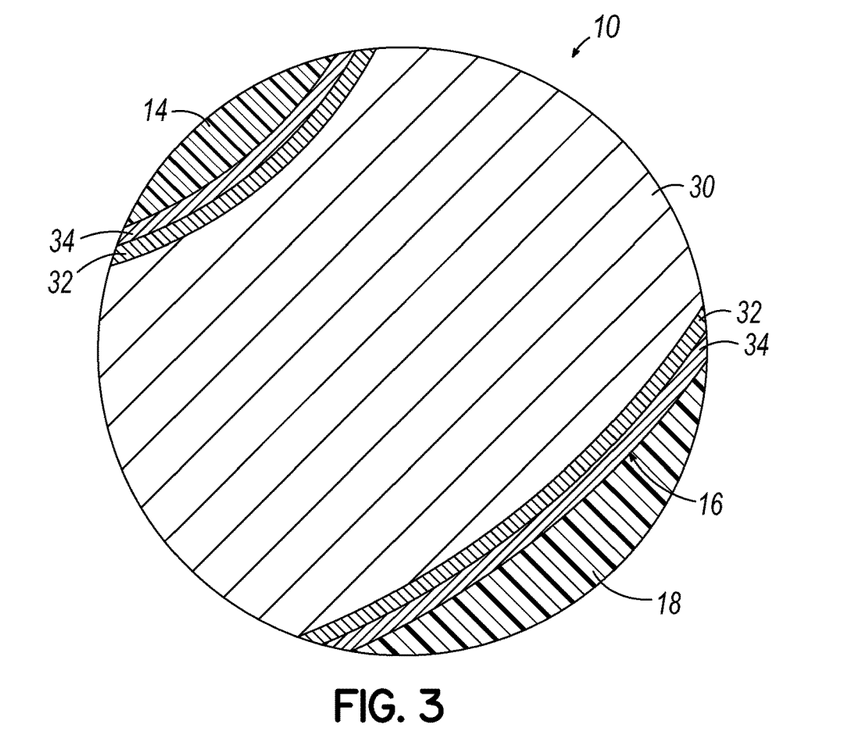
FIG. 3 is an exploded cross-sectional view of the view illustrated in FIG. 1A in accordance with an embodiment of the invention.
Figure 4:
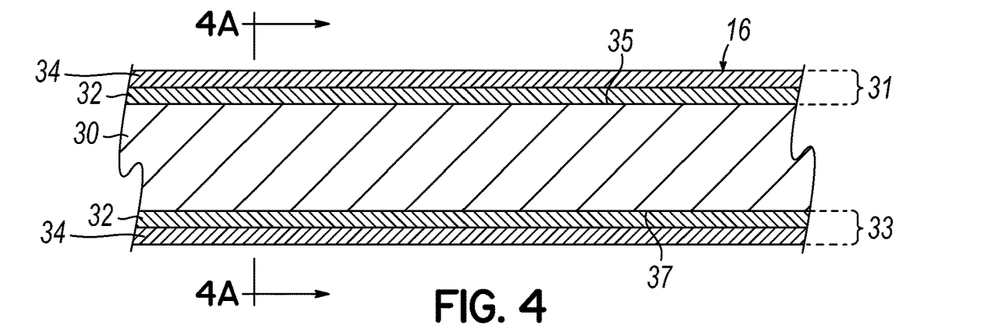
FIGS. 4 and 4A are cross-sectional views of a metalized CNT substrate in accordance with an embodiment of the invention.

As discussed herein with respect to FIGS. 3 and 4, the metal applied as a layer may include multiple metals applied sequentially as layers or sublayers to form a larger overall metal conductive layer. As such, the term "layer" as used herein is not limited to a single layer construction, but may also have multiple sublayers making up the larger conductive layer.

The CNT substrate, in one embodiment, is a non-woven, laminated CNT substrate. In one exemplary formation, the CNT filaments are generated by chemical vapor deposition and then sprayed onto a surface so as to create a non-woven laminated CNT sheet or substrate. The sheet/substrate may be formed either at the desired finished width of the substrate or may be formed as a larger sheet and then cut into thinner strips of substrate to be spliced together. In one embodiment, the CNT substrate has a contact resistance of around 25 Ohms per foot. As noted herein, the metalized CNT substrate is formed as essentially a thin and flexible conductive tape structure that may be wrapped around components or layers of the cable for forming the outer conductive layer or outer conductor similar to a tape wrap or foil wrap. The CNT substrate therefore must also have a suitable thickness such that when metalized with the one or more metal layers, the substrate is suitable for wrapping to form the outer conductive layer 16. The metalized CNT substrate is wrapped with attention to the wrapping parameters as discussed herein because, the metalized CNT substrate generally does not yield, stretch, or bend similar to typical insulative or metal foil tapes that might be utilized within such a cable construction. As such, unbalanced wrapping may cause deformation at the metal edges of the metalized CNT substrate that may result in cracking or breaking of the metalized edge. As noted herein, such a discontinuity at the edge of the metalized CNT substrate may have significant impacts in the electrical performance of the finished cable. Therefore, specific wrapping parameters are taken into account in the invention to ensure that the inventive metalized CNT substrate does not wrinkle, tear, or experience other failure during the construction of the inventive cable.

Figure 5:
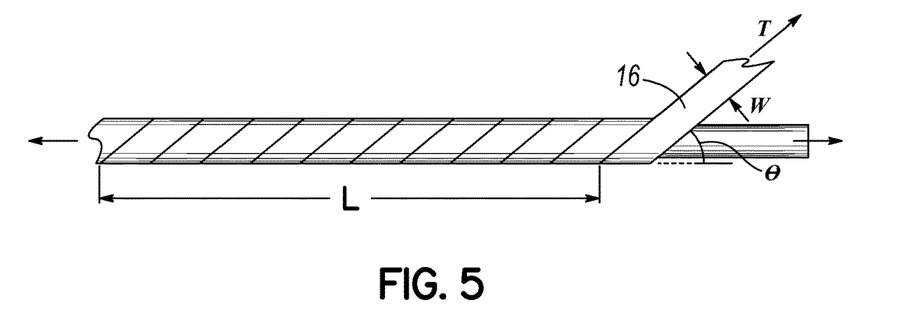
FIG. 5 a perspective view of the formation of a cable in accordance with an embodiment of the invention illustrating wrapping of a metalized CNT substrate.

In accordance with one aspect of the invention, the wrapping tension forces are balanced in both vertical and horizontal planes within an acceptable tolerance. In one embodiment the invention, the wrapped outer conductive layer of the CNT substrate is wrapped at an angle in the range of 40 degrees-50 degrees to the longitudinal axis of the cable. In one specific embodiment, the outer conductive layer is wrapped at an angle in the range of 45 degrees plus or minus 2.5 degrees (42.5-47.5 degrees). The inventors have discovered that the wrapping tension forces are more balanced in both the vertical and horizontal planes within an acceptable tolerance utilizing such a wrapping angle. Referring now to FIG. 5, deviation from the desirable 45 degrees wrap angle may present a tension variation in the vertical and horizontal planes. Such variation would have a tendency to deform the edges of the metalized CNT substrate, in order to address that tension variation. With such deformation, the metalized CNT substrate will fold over on itself creating large discontinuities in the outer conductive layer 16. Accordingly, the metalized CNT substrate is carefully applied as noted herein.

Referring again to FIG. 1A, a cross-sectional view of a cable 10 in accordance with one embodiment of the invention is illustrated and includes inner conductor element 12, an insulation layer 14 surrounding the inner conductor 12 and the wrapped outer conductive layer or conductor 16 including a metalized CNT substrate. A shield or shield layer might also be implemented into the construction. For example, the embodiment as shown in FIG. 7 illustrates an embodiment using a braided shield 20. Other layers, such as a jacket layer 18 may also be utilized for further insulation and protection of the coaxial cable. Such a jacket layer 18 may be a suitable insulative or dielectric material, such as fluorinated ethylene propylene (FEP) and may be extruded onto the outside of layer 16 and/or other layers or wrapped or otherwise applied as would be known in the art. An outer jacket might have a thickness in the range of 0.002 to 0.020 inches. Various embodiments of the invention, as disclosed herein may use a braided shield layer in addition to the metalized CNT substrate layer 16 and all layers would be covered by the outer jacket layer 18.

Referring to FIGS. 3 and 4, cross-sections illustrate the unique construction of the outer conductive layer 16 including a CNT substrate 30 and one or more metals applied as layers to the CNT substrate 30 to form a metalized CNT substrate. As illustrated in FIG. 3, metal layers are applied on both opposing faces or sides of the CNT substrate. Accordingly, when the metalized CNT substrate is wrapped it forms an outer conductive layer 16 that includes at least a first metal layer, then the CNT substrate, and then at least a second metal layer. As noted herein, one desirable wrap configuration as shown in FIG. 5 would include a 50% overlap in the formation of layer 16. As will be appreciated, the cross-sectional illustration in FIG. 3 does not indicate that overlap for the purposes of illustrative simplicity, but as will be appreciated, the overlap will create multiple overlapped metal layers at certain points in the wrapped outer conductive layer 16 along the length of the cable.

FIG. 4 illustrates the metalized CNT substrate 16 utilized in the invention and prior to wrapping which includes the inner CNT substrate 30 as well as the metal layers that are applied to or coat the CNT substrate. In the invention as described herein, two metal layers are applied to the CNT substrate 30. However, the invention is not limited to the number of metal layers applied to the CNT substrate.

Figure 4A:
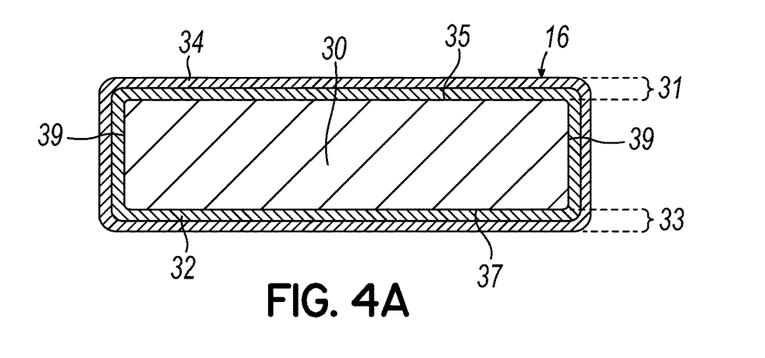

In looking at the cross-section of FIG. 4, the outer conductive layer 16 includes a first metal layer 31, the CNT substrate 30, and a second metal layer 33. The layers 31, 33 may be a single metal, such as copper or silver, or may be actually formed of a plurality of sublayers 32, 34 consisting of different metals. In accordance with one embodiment, the metal layers 31, 33 are formed by applying metal as a continuous layer over the entire CNT substrate 30. As may be appreciated, the CNT substrate, such as in a tape form, will include opposing face surfaces 35, 37 and generally opposing edges 39 (see FIG. 4A). At least one metal is applied as a continuous layer over the opposing face surfaces 35, 37 and edges 39 of the CNT substrate 30 to form a metalized CNT substrate as shown in FIG. 4A. The metal might be applied, for example, in an electroplating process to cover all surfaces of the CNT substrate 30. A plurality of metals might be applied as layers, such that the metal layers 31, 33 include multiple metal layers or sublayers 32, 34. For example, one layer might be applied, or a plurality of layers 32, 34 might be applied as appropriate in the construction of the cable 10 of the invention. Multiple layers 32, 34 are cumulative to form the overall thickness of the metal layers 31, 33 that are on the face surfaces 35, 37 and that capture the CNT substrate therebetween.

In one embodiment of invention, the inner or first metal sublayer 32 is formed of copper and the outer or second metal sublayer 34 is formed of silver applied over the copper sublayer 32. The order of those sublayers might also be reversed so that silver is applied first at sublayer 32 and then copper at the sublayer 34. Or as noted, layers 31, 33 might be a single metal. As seen from the cross-sections of FIGS. 4 and 4A, both sides of the CNT substrate 30 are metalized so that essentially a metalized CNT substrate forms a flat metalized structure that is utilized and wrapped over the inner conductor and insulation for forming the outer conductive layer 16 of the invention. Additional layers, not shown, might be plated on the conductive copper and/or silver metal layers. For example, nickel or tin layers may be used for stability of the conductive layers. So metal layers 31, 33 may include a plurality of different metals and sublayers, In accordance with another aspect of the invention, the unique metalized CNT substrate forms a conductive CNT structure that is used for a wrapped conductive layer around an inner conductor, an insulation layer, and any other layers inside of the outer conductive layer. Layer 16 performs as an outer conductor without the need for a separate foil layer. Therefore, the conductive outer layer 16 may be formed in a single wrapping process using the metalized CNT substrate of the invention. The metalized CNT substrate used for making layer 16 has a particular tensile strength when created that must be taken into account when the outer conductive layer 16 is wrapped around the inner conductor element and any other intervening layers. Furthermore, the metalized CNT substrate 16 creates a unique element that is different from typical foils and foil tapes and thus must be carefully applied since it does not provide the standard yield, stretch or bend of conventional foil elements. Furthermore, care must be taken to prevent the deformation of the metalized edges of the CNT substrate in order to avoid significant cracking or breaking of the metal at the edges, which may have significant impacts on the electrical performance of the overall cable.

The embodiments of the present invention present significant advantages to typical cable construction using metal foils or foil layers. In one aspect, the present invention creates a significant weight savings versus cables with traditional foils. This is important in weight sensitive applications, such as aerospace applications. Furthermore, the invention provides significant improvements in the shielding versus just using CNT material and eliminates the additional manufacturing steps of adding a foil layer in combination with CNT layers. The metalized CNT substrate of the invention reduces signal loss while the mechanical strength of the metalized CNT substrate increases the mechanical flex life of the cable versus a traditional foil cable. The metalized CNT substrate further provides thermal conductivity that protects the cable at higher temperatures. Still further, the invention improves connectivity scenarios as the continuous metal layer(s) and metal edges provide solderability to the entire length of the metalized CNT layer, not only the ends.

Accordingly, the inventors have had to address various unique features in the construction of the cabling of the invention. Wherein a standard foil layer might be wrapped at an 83 degrees tape wrap angle, the inventors discovered that such a typical tape wrapped angle is not suitable for the present invention. As such, the present invention provides a unique construction process utilizing the metalized CNT substrate of the invention in order to ensure that the plated substrate does not wrinkle, tear or experience other plating failure during the cable construction. To that end, as noted, the inventors discovered that a wrap angle in the range of 40-50 degrees and more specifically in the range of 45 degrees+/−2.5 degrees with respect to the cable longitudinal axis provides a desirable cable construction while avoiding some of the issues noted above with respect to the metalized CNT substrate and its wrapping.

Figure 6:
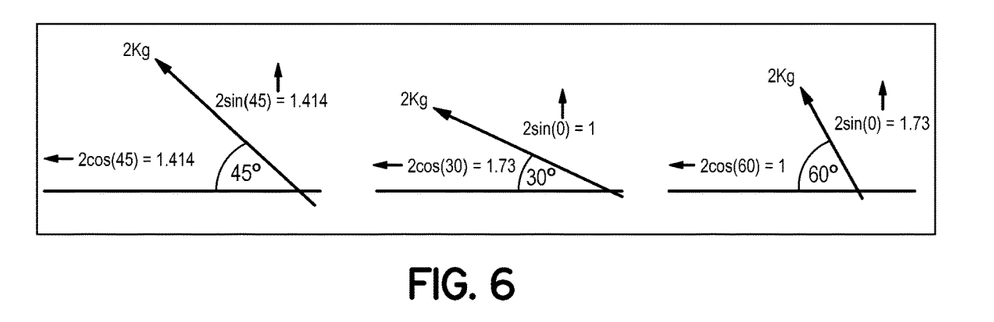
FIG. 6 is an illustrative diagram showing the features of a wrap angle in accordance with an embodiment of the invention

Referring to FIG. 5, the metalized CNT substrate has a width W and is applied at a wrap angle $\Theta$ of 45 degrees+/−2.5 degrees to ensure that the edges of the plated substrate do not have to significantly deform in the formation of outer conductive layer 16 along the length L of the cable 10. More specifically, as illustrated in FIG. 6, deviation from the inventive 45 degrees wrap angle will create a situation where the edges of the metalized CNT substrate will have to deform significantly to account for the tension variation within the tape tension T as shown in FIG. 5. With such a deformation, the wrapped metalized CNT substrate will fold over on itself and create large discontinuities in the outer conductive layer.

In accordance with another aspect the invention, the inventors have determined a relationship for the wrap angle used in the present invention taking into account the dimensions of the metalized CNT substrate as well as the diameter of the inner conductor core to achieve the desired range for the wrap angle. Specifically, Equation 1 illustrates an exemplary formula for using the 45 degrees wrap angle for iterative determination of a suitable substrate width and thickness:

$$\text{Tape Wrap Angle(Degrees)} = \cos^{-1}\left(\frac{2\times \text{Width} + 2\times \text{Thickness}}{4\times \pi \times (\text{Core Diameter} - \text{Thickness})}\right)\times \frac{180}{\pi} \quad \text{EQ. 1}$$

Utilizing equation 1, using the width and thickness of the substrate or tape, as well as the diameter of the inner conductor core that is to be wrapped, iterative techniques are used to achieve the desired wrap angle. As noted herein, CNT substrates having different widths and thicknesses that might be implemented to achieve a cable construction having the desired wrap angle. For example, in accordance with the aspects of the invention, if a specific tape is to be utilized, having a width and thickness, the core, as defined by the inner conductor 12 and insulative layer or dielectric 14 would have to be designed to maintain the 45 degrees wrap angle. Alternatively, the core might be known or selected and then the tape width and thickness designed in order to maintain the 45 degrees wrap angle or some range of wrap angle as noted herein. In accordance with another feature of the invention, the wrap angle can be fine-tuned in accordance with the invention by selecting a width of the CNT substrate and then adjusting the metal layer thickness to refine the wrap angle to the desired amount. Alternatively, the thickness of the CNT substrate might be known and then the width of the substrate as well as the core diameter might be determined for achieving a desirable wrap angle.

In accordance with another aspect of the invention, because of the unique construction of the metalized CNT substrate as used to form an outer conductive layer, the tension during application of such a substrate also must be addressed. Depending upon the CNT substrate, any weak points must be addressed by a suitable wrapping tension T as illustrated in FIG. 5 in order to prevent breakage. For example, in accordance with one exemplary embodiment for a CNT substrate that may be for the invention, CNT sheets are formed and then cut into strips of a desired width to be spliced together to form the elongated and continuous length substrate. As such, weak points in the structure of the CNT substrate may exist. Through the metallization plating process of the invention, further weakness might be introduced. In order to avoid breakage during the wrapping process, suitable tape tension must be implemented in accordance with the invention. The inventors have determined that to control the tension to provide optimal wrapping of the metalized CNT substrate in the layer 16 formation and to minimize any breakage, the wrapping tension or tape tension may be fractionally determined based upon the ultimate tensile strength or break strength of the metalized CNT substrate. That is, the wrap or tape tension is proportional to the tensile strength of the substrate. To determine the tensile strength of the plated substrate, a tensile tester might be implemented.

In accordance with one embodiment the invention, a tape tension might be provided through Equation 2 to below $$\text{Tape Tension(kg)} = \left(\frac{\text{Tensile Strength (lbs)} \times 0.4536}{11.5}\right) \quad \text{EQ. 2}$$

Then, any equipment used for wrapping the plated substrate will control the tension in order to stay within a suitable range for wrapping the product. Furthermore, the wrapping process may be optimized to reduce any drag forces or any tension spikes within the wrapping process and otherwise control wrapping variation.

Generally, the metalized CNT substrate is wrapped in an overlap fashion to surround the layers. For proper coverage of the cable components in the formation of the outer conductive layer 16, the metalized CNT substrate is wrapped to provide an overlap of 50 percent or more, as shown in the overlap wrapping in FIG. 5.

FIG. 7 illustrates an alternative embodiment of the invention wherein cable 10a uses a braid layer 20 over top of the outer conductive layer 16 as a further conductive layer or shield. In one embodiment, the braid layer 20 may be a braid layer of metalized Kevlar, as used in some existing cable designs. The braid layer is woven or applied over the metalized CNT outer conductor 16. In an alternative embodiment of the invention, the braid layer 20 is formed utilizing metalized CNT yarns that are formed and constructed as described herein. As such, for some embodiments, the cable may include both a metalized CNT outer conductor 16 as well as a metalized CNT filament braid. In other embodiments, the outer conductive layer 16 as shown in FIG. 7 might be a traditional metal foil wherein the braid layer 20 uses metalized CNT filaments in accordance with the invention. Specifically, the yarns forming braid layer 20 will comprise a plurality of CNT filaments. One or more metal layers are then applied to the filaments such as copper and silver metal layers. As used herein, the term filament is used to refer to the basic CNT fiber unit that will then cumulatively be brought together to form larger "yarns". The terms "filament" or "yarn" are not limiting to the invention. The individual metalized filaments are constructed into yarns, and the yarns are utilized to form a braid layer 20 as shown. The braid layer is formed using the CNT plated yarns generally by laying the various metalized CNT yarns in parallel to form suitable ribbon structures 21 or ribbons and then the ribbons are woven as illustrated in FIG. 7 to form a braid structure. Such formation of a braid structure is done in a fashion as would be understood by a person of ordinary skill in the art in forming other braided shield layers. As may be appreciated, each of the ribbon structures 21 may incorporate a suitable number of yarns to achieve a desired ribbon width and ultimately a desirable overall diameter for the braid layer 20 for a particular size of cable. For example, the braid layer 20 might each include from 8-96 yarns per ribbon to achieve the desired width and the ultimate diameter of the braid layer. The metalized CNT braid layer 20 acts as a braided shield layer in the cable as shown in FIG. 7.

Figures 8, 9:
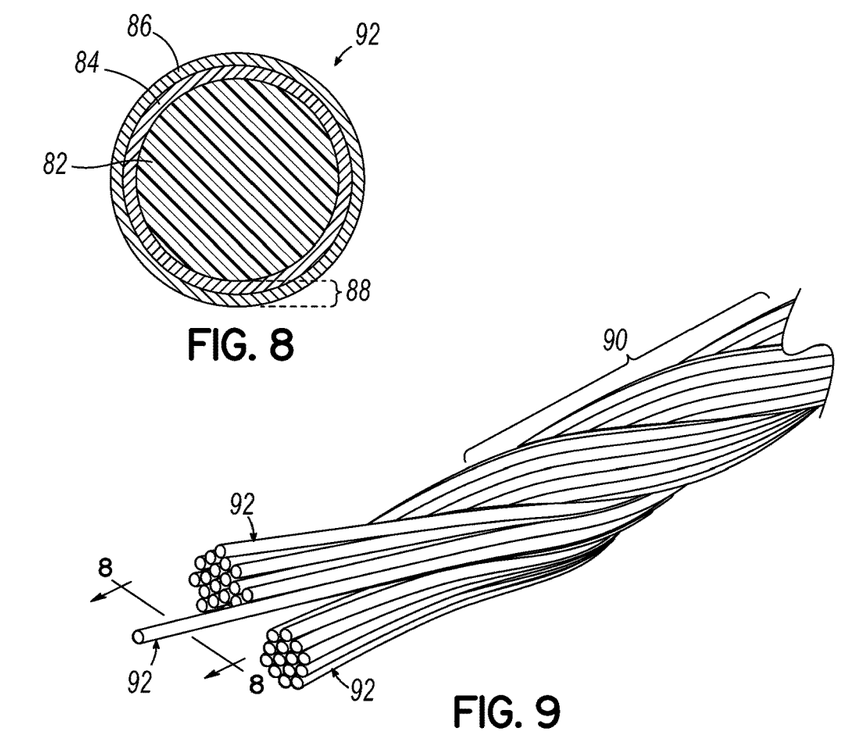
FIG. 8 is a cross-sectional view of a metalized CNT filament in accordance with an embodiment of the invention
FIG. 9 is a perspective side view of a CNT yarn with metalized CNT filaments as illustrated in FIG. 8.

In accordance with one aspect of the invention, each of the yarns utilized in the braid layer, as shown in FIG. 7 comprises a plurality of individual thinner CNT filaments which are metalized with conductive layers in accordance with the invention. Specifically, referring to FIG. 8, a cross-section of a coated or plated metalized filament 92 is illustrated for use in components of the invention cable and includes a CNT core 82 that is formed as a thin filament. The CNT filament 82 may have a diameter of 10-50 microns. Each of the filaments 82 then has one or more metals applied as a layer such as a layer of copper 84 and/or a layer of silver 86. The illustrated embodiment of FIG. 8 shows two sublayers 84, 86 that form a metal layer 88 but a single metal may form layer 88. Additional outer layers, such as an outer layer of nickel or tin may be utilized as discussed herein for stability. As such, the filaments might be metalized with one or more metals as discussed with respect to the metalized CNT substrate.

Referring to FIG. 9, a CNT yarn 90 is illustrated which comprises a plurality of thin CNT filaments 92. For the purposes of metalizing the CNT filaments with appropriate conductive layers 88 or 84, 86 as illustrated in FIG. 8, the individual filaments 92 may be untwisted or bundled loosely to provide some separation in the individual filaments. In one embodiment of the invention, the filaments (such as in a loose bundle) are passed through an appropriate electroplating process as disclosed herein to provide continuous applications of appropriate metals on the filaments and to achieve the metalized filament cross-section as illustrated in FIG. 8. Then, the metalized CNT filaments may be twisted or otherwise bundled into an appropriate yarn to be used in a braid layer 20 or used to form a stranded inner conductor element as disclosed herein.

Metalized CNT yarn 90 of the bundles of filaments 92 may be twisted and formed in a variety of different ways, such as utilizing stranding patterns as often utilized for stranded wire conductors. For example, all the coated CNT filaments 92 may be bunched and simply twisted together to form the yarn. Alternatively, a concentric stranding pattern may be utilized such as a single filament surrounded by six filaments and then surrounded by twelve filaments to form a layer, etc. as the yarn is built up (often referred to as a 6-6-12 design). In one example, each subsequent yarn layer may be twisted in a different direction than a previous stranded yarn layer. Alternatively, each of the stranded yarn layers might be twisted in the same direction to form the yarn 90. The metalized CNT yarn 90 then serves as a building block to be brought together with other yarns 90 for forming braid layer 20 as illustrated in FIG. 7 and also for forming a CNT inner conductor element 12 as discussed herein.

The number of filaments within each yarn may be in a range of 1-1000. Depending upon the element being constructed with the yarns, such as braid layer 20 or an inner conductor element 12, different numbers of filaments may make up the yarn that is used to form a component and to increase or decrease the diameter of the yard, as appropriate. Because each of the CNT filaments are metalized in one embodiment, when twisted together to form a yarn, good electrical contact is formed between each metalized CNT filament. Generally, those yarns that are used to form ribbons that are woven together to form the braid layer 20 might be smaller than those yarns used to build up and form an inner conductor 12.

Figure 10:
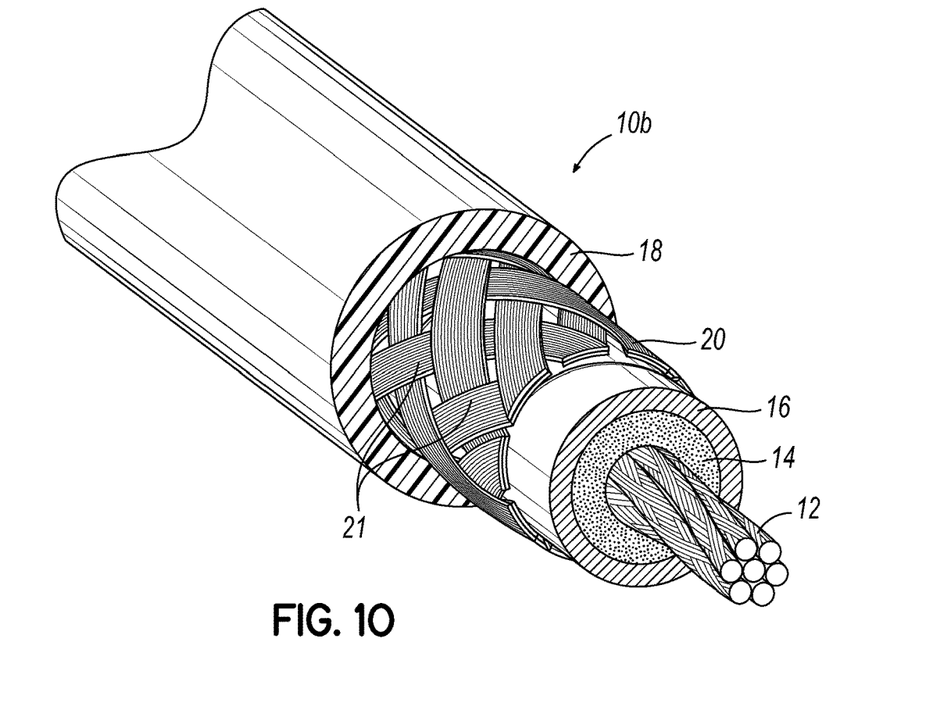
FIG. 10 is a perspective view, in partial cross-section, of a cable formed in accordance with another embodiment of the invention.

In accordance with one embodiment the invention, the individual yarns 90 may be laid generally parallel to form one or more ribbons 21 which are used to weave a braid layer 20 as shown in FIG. 10 in accordance with existing braiding methodology. However, the weight of such a braid layer 20 is significantly reduced because of the utilization of the metalized CNT filaments in the construction.

The plurality of yarns utilized to form the ribbon for a braid layer 20 may be in the range of 1-50 yarns. Then, each of the ribbons 21 is accordingly braided to form the outer braid layer 20. As noted, in accordance with one embodiment of the invention, shield layer 20 might be constructed which incorporates a metalized CNT braid layer 20 as described herein, in combination with a metalized CNT substrate inner conductive layer 16. More specifically, referring to FIG. 10, a cable 10b illustrated has an inner conductor 12, an insulation layer 14, an outer conductive layer 16, and then a braid layer 20 positioned over those layers. In such an embodiment, both inner conductive layer 16 and braid layer 20 incorporate the metalized CNT technology herein. Accordingly, the cable embodiments of the invention implement a metalized CNT braid layer 20 in addition to the metalized CNT outer conductive layer 16.

Figure 11A:
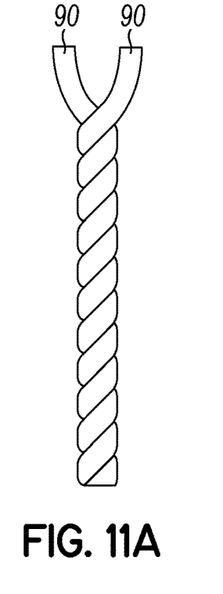
FIGS. 11A-11C are perspective views of CNT inner conductor elements with different ply constructions in accordance with embodiments of the invention.
Figure 11B:
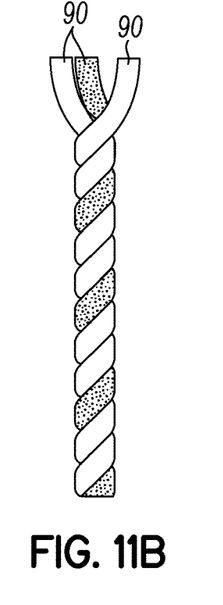
Figure 11C:
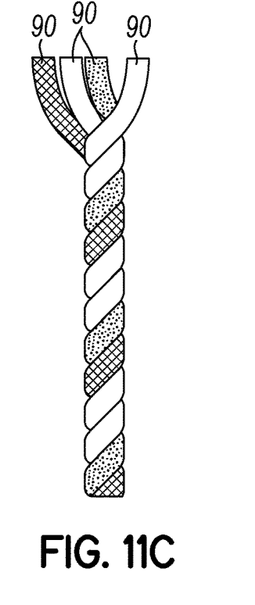
Figure 12:
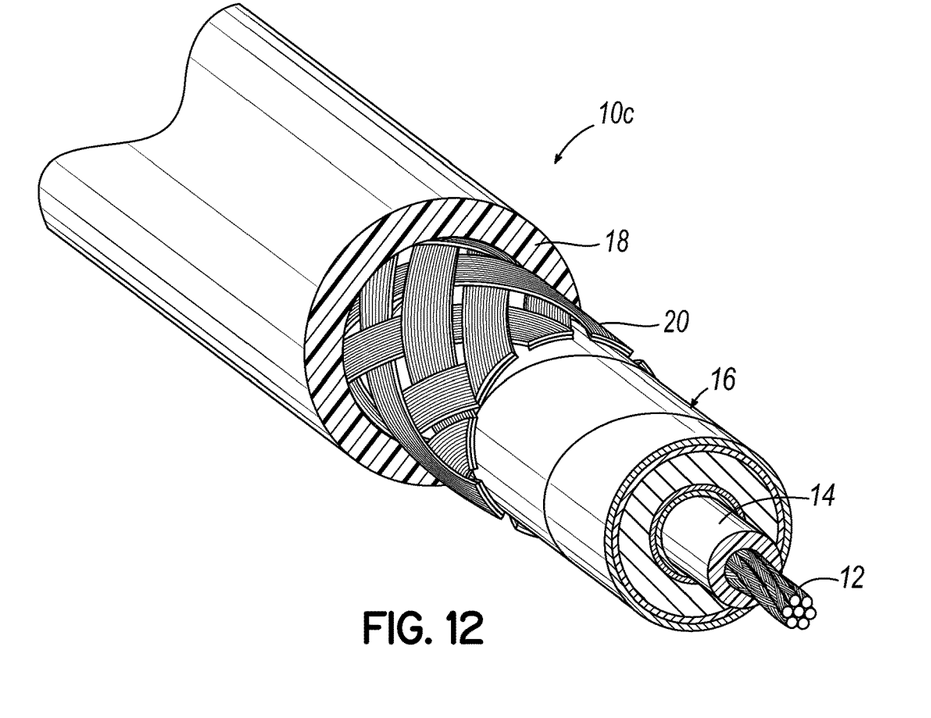
FIG. 12 is a perspective view, in partial cross-section, of a cable formed in accordance with another embodiment of the invention.

In accordance with another aspect of the invention, the metalized CNT yarns 90 formed in accordance with the invention may also be utilized to form an inner conductor element 12 for one or more of the cable embodiments as illustrated herein. That is, the various metalized CNT yarns 90 may themselves be twisted or bundled together as strands within a multi-ply construction to form a stranded inner conductor element 12. Referring to FIGS. 11A-11C and 12, various yarns 90 may be twisted together in a multiple ply construction to make a finished stranded inner conductor element 12 for utilization within the various cable embodiments described herein. For example, FIG. 11A illustrates a two-ply construction wherein two yarns are twisted together. Alternatively, FIG. 11B illustrates a three-ply construction and FIG. 11C illustrates a four-ply construction. As will be understood, the number of yarns implemented and the size of the yarns to make an inner conductor element 12 of an appropriate diameter is not limited to the particular numbers as illustrated in the exemplary figures of FIG. 11A-11C. As with the CNT braid layer 20, the individual filaments 92 that make up the yarns 90 in FIGS. 11A-11C are CNT filaments that are metalized as described herein and illustrated in FIG. 8. These individual metalized CNT filaments are then twisted or bundled appropriately utilizing a number of different known stranding techniques to form the yarn 90. The individual yarns are again twisted or bundled together to form a stranded inner conductor element 12 of the appropriate dimension and with appropriate current handling capability. FIGS. 7, 10, and 12 illustrate examples of stranded inner conductors for the cables. Those inner conductors 12 may also be solid inner conductors for each of those cable constructions. To form a stranded inner conductor, yarns having a plurality of filaments 92 in the range of 1-1000 may be used.

FIG. 12 is a cross-sectional view of a suitable cable 10c that may incorporate the metalized plated CNT outer conductive layer 16 and metalized CNT braid layer 20 formed of metalized CNT filaments as disclosed herein and further may incorporate a stranded metalized CNT inner conductor 12. As such, cable 10c would incorporate both a metalized CNT filament inner conductor element 12 and braid layer 20 in addition to a metalized CNT outer conductive layer to provide a robust and very lightweight cable with suitable electrical properties to replace existing cables utilizing metal inner conductor elements, foil layers, and braid layers.

In accordance with one embodiment of the invention, the metalized CNT elements of the invention, whether metalized filaments or a metalized substrate are uniquely formed through a continuous metallization process, such as, for example, an electroplating process utilizing biased electrical contact rollers as well as various submerged electrodes for plating all surfaces of the CNT substrate or all around the filaments in continuous metal layers.

Figure 13:
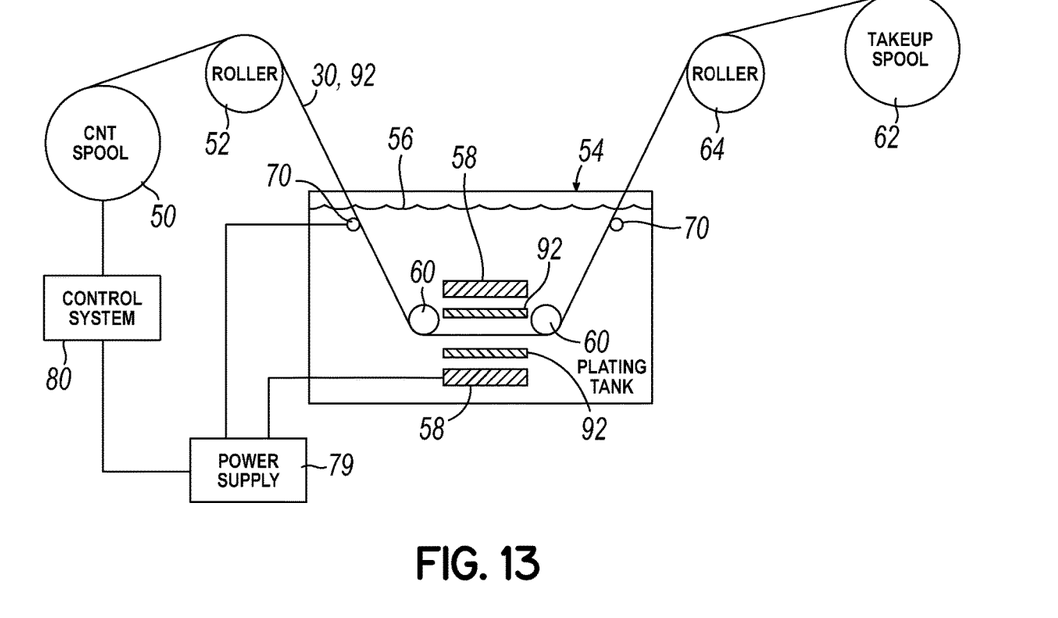
FIG. 13 is a schematic view of an electroplating system for forming metalized CNT substrates and CNT filaments in accordance with embodiments of the invention.

FIG. 13 illustrates one system in accordance with the invention using an electroplating process wherein a spool 50 of the CNT substrate or of the CNT yarns with individual CNT filaments is spooled through one or more appropriate rollers 52 into a plating tank 54 containing a suitable electrolyte solution 56 into which is submerged one or more metal anodes 58. The CNT substrate 30 or CNT filaments 92 are directed through the plating tank 54, over rollers 60 in a particular orientation and then back to a take-up spool 62 over one or more additional rollers 64. The substrate runs continuously in the tank between the anodes to form continuous metal layers. As may be appreciated, the way in which the CNT substrate or CNT filaments are introduced into the plating tank 54 and then taken up is not limited to the particular arrangement set forth in FIG. 13. Other different arrangements and angles of travel for the CNT substrate might be implemented depending upon the dimensions of the tank 54 as well as the placement of the various cathodes and anodes used for the electroplating process.

Referring to FIG. 13, electrical contact elements 70 are engaged with the CNT substrate 30/filaments 92 as they pass through tank 54. The electrical contact elements act to bias the CNT substrate/filaments and create an electrode or cathode element within the electroplating process of tank 54. The electrical contact elements may be stationary or may spin similar to a roller. Similarly, depending upon the metal to be plated onto the CNT substrate/filaments, one or more metal anode elements or structures 58 are positioned proximate the opposing sides of the CNT substrate/filaments and are biased to act also as electrodes or anode elements. As illustrated in FIG. 13, the anode elements 58 might include metal brick structures which provide the metal within the electrolyte solution for coating or metalizing the substrate/filaments. The metal anode elements 58, which may be copper or silver or some other metal layer material, are shown positioned on opposite sides of the CNT substrate/filaments for plating face surfaces and generally plating the entire CNT substrate/filaments. The anode and cathode elements are coupled to an appropriate power supply 79. Generally, in formation of the plated CNT substrate/filaments, the substrate/filaments are run through the plating tank 54 at a desirable line speed with desirable current settings to the electrodes to provide the application of an adequate metal layer thickness on the CNT elements. It is desirable to provide the necessary conductivity with respect to the invention for utilizing the metalized CNT substrate as an outer conductive layer of a cable or using the filaments/yarns in the inner conductor elements or braid layers. Care is taken not to deposit too much metal so as to make the plated CNT elements too stiff and brittle and difficult to utilize in the formation of the cable. The system of FIG. 13 might be controlled through an appropriate control system 80 that may be appropriately coupled with the feed system (50, 62) and/or the power supply 79 to control the line speed of the substrate or filaments through the tank as well as the power delivered through the anode and cathode elements for the process.

Exemplary CNT substrates 30 may have a thickness in the range of 0.0010 to 0.0020 inches, and a width in the range of 0.300 to 0.500 inches. One suitable substrate is a Miralon® substrate from Nanocomp Technologies of Merrimack, NH For example, substrates of 0.0015 inch thickness in widths of 0.3125 inches or 0.500 inches might be used as a CNT substrate 30 for the invention. In accordance with one exemplary embodiment of the invention, a metal layer of thickness in the range of 30-300 micro-inches might be applied. Furthermore, in one exemplary embodiment using a plurality of metals, a layer of electroplated silver may be utilized over the layer of electroplated copper in the range of 30-150 micro-inches wherein the silver layer has a thickness in the range of 40-150 micro-inches, and in one embodiment around 40 micro-inches to provide suitable corrosion resistance for the metalized substrate.

Exemplary filaments 92 may have a diameter in the range of 10-50 microns. One suitable yarn of filaments is available from DexMat of Houston, Tex. The applied metal layers 84, 86 may have a thickness of 30-400 micro inches. In one embodiment, the metal layer 82 may include a copper layer of thickness in the range of 30-150 micro inches and a silver layer 84 with a thickness in the range of 40-150 micro inches.

The processing parameters for the electroplating system of FIG. 13 might be varied for optimal plating through control system 80. In one exemplary embodiment, an electroplating current setting of 2-3 Amps was utilized at a line speed of 0.5-1 ft/min for plating the copper layer. Similarly, for the silver layer, a current setting of around 0.25-0.8 Amps was utilized at a line speed of 0.5-1 ft/min. In one embodiment, the DC resistance of the metalized CNT substrate was in the range of 0.3-1 Ohms per foot. Alternatively, the DC resistance of the fiber or untwisted bundle of individual filaments, was in the range of 1-50 Ohms per foot. The metalized substrate or metalized filaments may then be spooled onto a suitable spool, such as a bi-conical spool. It will be understood by a person on ordinary skill in the art that the noted current settings and line speeds may be varied depending upon the arrangement within the electroplating system as well as the dimensions of the tank, the width and thickness of CNT substrate, diameter of filaments, etc.

In accordance with the aspects of the invention, a metal layer is applied on both sides or face surfaces of the CNT substrate as well as the edges. Preferably, the layer is a continuous layer of uniform thickness which will provide for suitable wrapping in the cable construction and uniform contact of the overlapping wrapped layers. To that end, when forming metalized CNT substrate, the invention prevents excessive buildup of metal on the edges of the CNT substrate. Referring to FIG. 13, one or more shields 92 are utilized within the tank 54 and are positioned between the respective anodes 58 and the CNT substrate 30. Generally, such shielding will only be utilized in plating the CNT substrate 30 of the invention. The shielding is configured to physically block the electrical anode path to the edges 39 of the substrate 30. Preferably, a shield 92 would be utilized on both sides of the substrate 30 and would be positioned as shown in FIG. 13 between the anode 58 and the CNT substrate 30. The shield functions to generally block the anode's path at the edges only to prevent preferential plating or over-plating of the edges 39.

Figure 14:
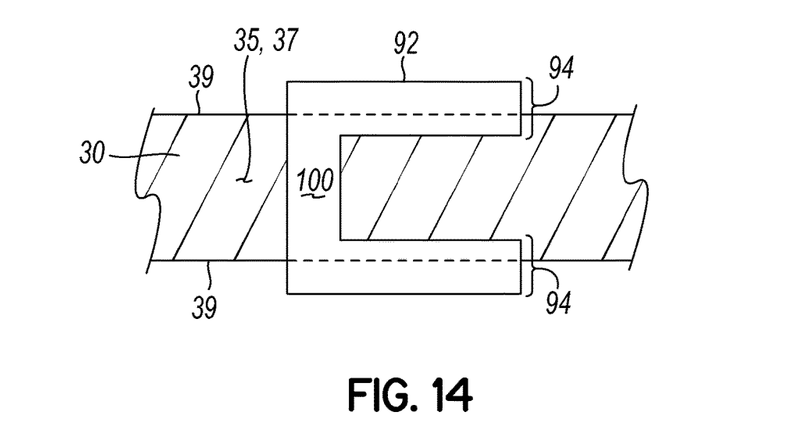
FIG. 14 is a schematic view of an embodiment of a shield element for use in the system of FIG. 13.

To that end, as illustrated in FIG. 14, one particular shield 92 is shown. The shield 92 is preferably formed of a non-conducting material such as plexiglass, acrylic, or other plastic or non-conductive materials. It may be in the form of a sheet of such material. As illustrated, the shield 92 will incorporate edge blocking sections 94 which extends over the edges 39 of substrate 30. To that end, the portions 94 provide a physical blocking of the edges from the anode's path. The two edge portions 94 may be coupled together by a connecting portion 100. Then, the shield 92 may be appropriately secured with respect to the CNT substrate 30 and the anodes 58 in tank 54. As noted, generally the shields 92 would be positioned and implemented on both sides of the substrate 30. The shields 92 will be secured as appropriate for the proper positioning within the tank 54 by suitable mounting structures (not shown).

Alternatively, shield portions 94 of shield 92 may be two separate strip portions that are individually mounted proximate the edges 39 of the substrate for performing a similar blocking or shielding function. As such, the specific shape of shield 92 is not critical to the invention as long as portions 94 of the shield extend over the edge 86 at a suitable length and suitable width to prevent over accumulation of metal at the opposing edges. The length of the shield 82 along the length of the substrate and the width of the portions 94 with respect to the edges 39 will also have suitable dimensions to ensure that over-plating of the edges is prevented.

While the present invention has been illustrated by a description of various embodiments and while these embodiments have been described in some detail, it is not the intention of the inventors to restrict or in any way limit the scope of the appended claims to such detail. Thus, additional advantages and modifications will readily appear to those of ordinary skill in the art. The various features of the invention may be used alone or in any combination depending on the needs and preferences of the user.

What is claimed is:

1. A cable comprising:
   at least one inner conductor;
   an insulation layer surrounding the inner conductor;
   an outer conductive layer including:
      a carbon nanotube substrate having opposing face surfaces and edges;
      a plurality of metal layers applied as continuous conductive layers over the opposing face surfaces and edges of the carbon nanotube substrate for forming a metallized carbon nanotube substrate;
   the continuous conductive layers including a continuous layer of copper applied as a layer on the carbon nanotube substrate, and a continuous layer of silver applied as a layer on the carbon nanotube substrate, to form a conductive layer of silver and copper;
   the metallized carbon nanotube substrate being wrapped to surround the insulation layer and center conductor for forming the outer conductive layer having the conductive layer of silver and copper as an outermost layer, the carbon nanotube substrate and the conductive layer of silver and copper as an innermost layer over the insulation layer;
   the metallized carbon nanotube substrate being wrapped at a tension around the insulation layer and center conductor, the tension being proportional to the tensile strength of the metallized carbon nanotube substrate.

2. The cable of claim 1 wherein at least one of the metal layers of the continuous conductive layers is applied to the opposing face surfaces and edges of the carbon nanotube substrate through an electroplating process for forming the metallized carbon nanotube substrate.

3. The cable of claim 2 wherein the at least one of the metal layers is applied to the carbon nanotube substrate through a continuous electroplating process.

4. The cable of claim 1 wherein the inner conductor is at least one of a solid conductor or a stranded conductor.

5. The cable of claim 1 wherein the metallized carbon nanotube substrate is wrapped in an overlap fashion with the innermost conductive layer of silver and copper of a wrap overlapping the outermost layer of the silver and copper of another wrap of the metalized carbon nanotube substrate to surround the insulation layer and inner conductor for forming the outer conductive layer.

6. The cable of claim 5 wherein the wrapped outer conductive layer is wrapped to provide an overlap of 50 percent or above of the innermost conductive layer of the silver and copper overlapping the outermost layer of the silver and copper of the previous wrap of the metalized carbon nanotube substrate.

7. The cable of claim 1 wherein the wrapped outer conductive layer is wrapped at an angle in the range of 40-50 degrees.

8. The cable of claim 7 wherein the wrapped outer conductive layer is wrapped at an angle in the range of 42.5-47.5 degrees.

9. The cable of claim 1 wherein the outer conductive layer includes the layer of copper applied initially as a layer on the carbon nanotube substrate, and the layer of silver applied over the copper layer.

10. The cable of claim 9 wherein the outer conductive layer includes the layer of copper that has a thickness in the range of 30-150 micro-inches and the layer of silver that has a thickness in the range of 40-150 micro-inches.

11. The cable of claim 1 wherein at least one of the plurality of metal layers has a thickness in the range of 30-300 micro-inches.

12. The cable of claim 1 wherein the carbon nanotube substrate has a thickness in the range of 0.0010-0.0020 inches.

13. The cable of claim 1 wherein the carbon nanotube substrate has a width in the range of 0.300-0.500 inches.

14. A cable comprising:
   at least one inner conductor;
   an insulation layer surrounding the inner conductor;
   an outer conductive layer surrounding the inner conductor and insulation layer and including:
      at least a first metal layer, including a sublayer of copper and a sublayer of silver;
      a carbon nanotube substrate with opposing face surfaces;
      at least a second metal layer, including a sublayer of copper and a sublayer of silver;
      the sublayers of copper and silver forming continuous conductive layers over each of the opposing face surfaces of the carbon nanotube substrate for capturing the carbon nanotube substrate between the first and second metal layers and forming a metalized carbon nanotube substrate;
      the metallized carbon nanotube substrate being wrapped to surround the insulation layer and inner conductor for forming the outer conductive layer, the metallized carbon nanotube substrate being wrapped at a tension around the insulation layer and center conductor, the tension being proportional to the tensile strength of the metallized carbon nanotube substrate.

15. The cable of claim 14 wherein the carbon nanotube substrate includes edges, the edges of the carbon nanotube substrate including a metal layer, including a layer of copper and a layer of silver that couple with the first and second metal layers.

16. The cable of claim 15 wherein the layer of copper and silver applied to form the metalized carbon nanotube substrate includes the sublayer of copper applied initially as a layer on the carbon nanotube substrate, and the sublayer of silver applied over the copper layer.

17. The cable of claim 14 wherein at least one of the first and second metal layers has a thickness in the range of 30-300 micro-inches.

18. The cable of claim 14 wherein the carbon nanotube substrate has a thickness in the range of 0.0010-0.0020 inches.

* * * * *